United States Patent [19]

Taguchi

[11] Patent Number: 5,097,303
[45] Date of Patent: Mar. 17, 1992

[54] ON-CHIP VOLTAGE REGULATOR AND SEMICONDUCTOR MEMORY DEVICE USING THE SAME

[75] Inventor: Masao Taguchi, Sagamihara, Japan

[73] Assignee: Fujitsu Limited, Kanagawa, Japan

[21] Appl. No.: 677,560

[22] Filed: Mar. 29, 1991

[30] Foreign Application Priority Data

Mar. 30, 1990 [JP] Japan .................. 2-83760

[51] Int. Cl.⁵ .......................... H01L 29/78
[52] U.S. Cl. .................. 357/23.6; 365/149; 365/185
[58] Field of Search ............ 357/23.6, 23.1; 365/149, 185, 228

[56] References Cited

U.S. PATENT DOCUMENTS

| | | | |
|---|---|---|---|
| 4,477,736 | 10/1984 | Onishi | 357/23.6 |
| 4,491,938 | 1/1985 | Leach | 357/23.6 |
| 4,636,658 | 1/1987 | Arakawa | 357/23.6 |
| 4,695,746 | 9/1987 | Tobita | 357/23.6 |
| 4,760,556 | 7/1988 | Deguchi et al. | 357/23.6 |
| 4,973,922 | 11/1990 | Embree et al. | 357/23.6 |

Primary Examiner—Georgia Epps
Attorney, Agent, or Firm—Armstrong, Nikaido, Marmelstein, Kubovcik & Murray

[57] ABSTRACT

An on-chip voltage regulator controls a gate of a regulator transistor having a first terminal connectable to receive an external power supply voltage and a second terminal connectable to an internal circuit formed on a chip on which the on-chip voltage regulator is formed. The regulator includes a clock receiving part for receiving a predetermined clock signal related to an operation of the internal circuit, and a regulator part for generating a gate voltage output to the gate of the regulator transistor on the basis of a state of the predetermined clock signal so that the regulator transistor can generate a substantially fixed internal voltage from the external power supply voltage irrespective of whether or not the internal circuit is operating.

30 Claims, 10 Drawing Sheets

ON-CHIP VOLTAGE REGULATOR AND SEMICONDUCTOR MEMORY DEVICE USING THE SAME

BACKGROUND OF THE INVENTION

The present invention generally relates to semiconductor integrated circuits, and more particularly to an on-chip voltage regulator for controlling the generation of an internal power supply voltage from an external power supply voltage.

As the feature scale of LSIs is decreasing, the size of transistors realized by LSIs is reducing, and the breakdown voltages of LSI transistors are decreasing. The are two possible approaches to optimize the relationship between the power supply voltage and the feature scale. The first approach is to produce a transistor having a gate length of approximately 0.8 micrometers which is enough to withstand a high power supply voltage equal to, for example, 5 volts. The second approach is to produce a transistor having a gate length of approximately 0.5 micrometers which is suitable for a decreased power supply voltage equal to, for example, 3.3. volts. It should be noted that the transistor produced by the second approach can operate faster than that produced by the first approach. It is thus concluded that the power supply voltage should be decreased to a suitable voltage as the integration density increases. On the other hand, many IC chips are designed to receive a standardized external power supply voltage equal to 5 volts. Thus, it is necessary to generate a suitably dropped power supply voltage from the standardized external power supply voltage inside of each IC chip.

FIG. 1A is a circuit diagram of a conventional on-chip voltage regulator designed to generate, from an external voltage, an in-chip voltage lower than the external voltage. A regulator transistor Q1 functions as a series control regulator with respect to an external power supply voltage $V_{EXT}$ equal to, for example, 5 volts. The regulator transistor Q1 generates an internal power supply voltage $V_{INT}$ equal to, for example, 3.3. volts from the 5.0V external power supply voltage $V_{EXT}$. The gate of the regulator transistor Q1 is charged by a voltage obtained by rectifying an A.C. signal generated by a ring oscillator OSC. The gate voltage now labeled $V_{G1}$ is clamped at a fixed voltage due to the function of a transistor Q4 because the source of the transistor Q4 is set to a reference voltage $V_{REF}$. The reference voltage $V_{REF}$ can be generated by a conventional method, for example, by using the threshold voltage of a MOS transistor.

A transistor Q2 functions to charge the gate of the regulator transistor Q1 when the power supply is turned ON. The reference voltage $V_{REF}$ is also applied to the gate of the transistor Q2 and the oscillator OSC. The reference voltage $V_{REF}$ enables the oscillator OSC to generator a fixed oscillation voltage. A capacitor C is connected between the oscillator OSC and the source of the transistor Q2, and functions to increase the charge voltage. For example, when the output voltage of the oscillator OSC is negative, the capacitor C is charged via the transistor Q2 so that the terminal of the C on the side of the transistor Q2 is positive. On the other hand, when the output voltage of the oscillator OSC is positive, the charge voltage is increased so that it becomes equal to the sum of the positive output voltage of the oscillator OSC and the voltage developed across the capacitor C. The oscillator OSC is used for generating the large gate voltage $V_{G1}$ of the regulator transistor Q1 in order to obtain the stabilized internal voltage $V_{INT}$. The oscillator OSC may be replaced by an alternative device, which oscillates and rectifies a voltage signal so that a peak voltage can be obtained.

FIG. 1B is a drain current ($I_D$) vs. a gate-source voltage ($V_{GS}$) of the regulator transistor Q1. The drain current $I_D$ can be defined as being $I_D = k(V_G - Vth)^2$ where k is a proportional constant, and Vth is the threshold voltage of the regulator transistor Q1. That is, the turn-ON characteristic curve of the regulator transistor Q1 is proportional to the square of the gate-source voltage $V_{GS}$ thereof. If current consumed in the chip varies by ΔI, the internal voltage $V_{INT}$ varies by ΔV. In the case of a DRAM, the current equal to approximately 0.1 mA passes through the regulator transistor Q1 in a standby mode. On the other hand, when an internal circuit of the DRAM is activated, the peak of the current passing through the regulator transistor Q1 becomes approximately equal to 100 mA. That is, the current obtained at the active mode is 1000 times the current obtained in the standby mode. It is possible to increase the gate width to increase the proportional constant k. However, an increase in the gate width decreases the integration density. It can be seen from the above explanation that it is impossible to regulate the internal voltage $V_{INT}$ at the fixed voltage in the state where the current consumed in the internal circuit is varying. Further, an increase in the gate width leads to an increase in a sub-threshold current, and the threshold voltage of the transistor Q1 is greatly decreased. Thus, if a change in the current consumed in the internal chip is equal to 1000 times that obtained in the standby mode, it causes great variations in the internal voltage $V_{INT}$.

FIG. 1C is another conventional on-chip voltage regulator directed to suppressing variations in the internal voltage $V_{INT}$. The gate voltage of the regulator transistor Q1 is controlled by an output of a current-mirror type analog differential amplifier, which is composed of transistors Q11–Q14. That is, a feedback signal is applied to the gate of the transistor Q12 from the source of the transistor Q1, that is, a node from which the internal voltage $V_{INT}$ is output. The reference voltage $V_{REF}$ is applied to the gate of the transistor Q11. Thus, the internal voltage $V_{INT}$ is automatically controlled so that it is always equal to the reference voltage $V_{REF}$. Thus, the internal voltage $V_{INT}$ is not greatly affected by variations in a load current, that is, the drain current of the transistor Q1.

Although the voltage stability is good, it is necessary to always pass currents equal to 100 microamperes through the transistors Q11 and Q12 in order to obtain a transfer (amplification) gain necessary for the analog differential amplifier circuit. Thus, a large amount of power is consumed in the circuit shown in FIG. 1C in the standby mode. Further, it is necessary to fabricate the circuit so that the feedback circuit can operate stably. If such a requirement is not satisfied, a ringing will occur in the internal voltage $V_{INT}$. In the worst case, the feedback circuit will oscillate.

SUMMARY OF THE INVENTION

It is a general object of the present invention to provide a novel and useful on-chip voltage regulator in which the aforementioned disadvantages are eliminated.

A more specific object of the present invention is to provide an on-chip voltage regulator capable of generating an internal voltage little affected by variations in the load current and consuming a small amount of current in the standby mode.

The above-mentioned objects of the present invention are achieved by an on-chip voltage regulator for controlling a gate of a regulator transistor having a first terminal connectable to receive an external power supply voltage and a second terminal connectable to an internal circuit formed on a chip on which the on-chip voltage regulator is formed, the on-chip voltage regulator comprising: clock receiving means for receiving a predetermined clock signal related to an operation of the internal circuit; and regulator means, coupled to the clock receiving means and the regulator transistor, for generating a gate voltage output to the gate of the regulator transistor on the basis of a state of the predetermined clock signal so that the regulator transistor can generate a substantially fixed internal voltage from the external power supply voltage irrespective of whether or not the internal circuit is operating.

Another object of the present invention is to provide a semiconductor memory device having the above-mentioned on-chip voltage regulator.

This object of the present invention is achieved by a semiconductor memory device comprising:

a first system operating in accordance with a first clock signal and having a memory cell array and a sense amplifier coupled to the memory cell array;

a second system operating in accordance with a second clock signal and having row address means for generating a row address from an external address and for outputting the row address to the memory cell array;

a third system operating in accordance with a third clock signal and having column address means for generating a column address from the external address and for outputting the column address to the memory cell array; and internal voltage generating means, coupled to the first, second and third internal voltages from an external power supply voltage on the basis of states of the first, second and third clock signals and for outputting the first, second and third internal voltages to the first, second and third systems, respectively, wherein the internal voltage generating means comprises:

a regulator transistor provided for each of the first, second and third systems and having a first terminal connectable to receive the external power supply voltage and a second terminal connected to a corresponding one of the first, second and third systems; and regulator means, connected to the regulator transistor, for generating a gate voltage output to the gate of the regulator transistor on the basis of the state of at least one of the first, second and third clock signals so that a corresponding one of the first, second and third internal voltages is substantially fixed irrespective of whether or not the corresponding one of the first, second and third systems is operating.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENT

Figure 2:
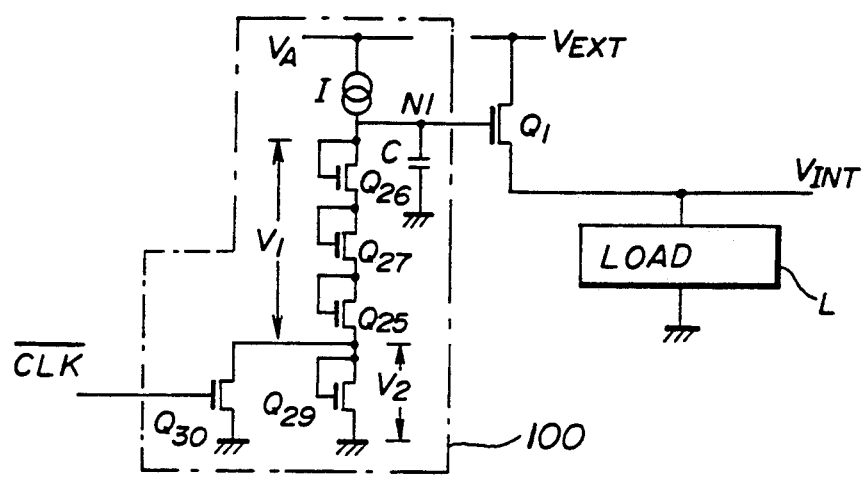
FIG. 2 is a circuit diagram of an on-chip voltage regulator according to a first preferred embodiment of the present invention.

Referring to FIG. 2, an on-chip voltage regulator 100 controls the regulator transistor Q1. The voltage regulator 100 has an input terminal receiving a clock signal $\overline{CLK}$, and an output terminal (node N) connected to the gate of the regulator transistor Q1 formed of an n-channel MOS transistor. The voltage regulator 100 is composed of a constant-current source I, diode-connected n-channel MOS transistors S26, Q27, Q28 and Q29 connected in series, an n-channel MOS transistor Q30, and a capacitor C.

The constant-current source I, and the transistors Q26–Q29 are connected in series and provided between a positive internal voltage line having a voltage $V_A$ and ground. The gate of each of the transistors Q26–Q29 is connected to the drain thereof. The transistors Q30 is connected in parallel to the transistor Q29. A low-active clock signal $\overline{CLK}$ is applied to the gate of the transistor Q30. When the clock signal $\overline{CLK}$ changes to a low level, a corresponding internal circuit (illustrated as a load L in FIG. 2) provided in the chip is activated. The capacitor C is connected between the node N1 and ground.

Assuming that each of the transistors Q26–Q29 has an identical threshold voltage Vth, V1=3Vth, and V2=Vth where V1 is a voltage developed across the series connected transistors Q26–Q28, and V2 is a voltage developed across the transistor Q29. When the clock signal $\overline{CLK}$ is maintained at a low level, the transistor Q30 is OFF, so that the voltage V2 is added to the voltage V1. When the clock signal $\overline{CLK}$ is switched to a high level, the transistor Q30 is turned ON, and thus the voltage V2 is equal to zero. That is, the potential of the node N1 (equal to the gate voltage $V_{G1}$ of the regulator transistor Q1) is equal to 4Vth (=V1+V2) when the transistor Q30 is OFF, and 3Vth (=V1) when the transistor Q30 is ON.

The load L (corresponding to an internal circuit) on a chip on which the voltage regulator is also formed is maintained in the standby mode, the low-active clock signal $\overline{CLK}$ is maintained at the high level. During this time, the transistor Q30 is conducting, the gate voltage of the regulator transistor Q30 is equal to the sum of the threshold voltages Vth of the transistors Q26–Q28. A bias current supplied to the transistors Q26–Q28 is supplied from the constant-current source I, which make it possible to provide the voltage V1 which does not change even if the voltage $V_A$ changes. It is preferable that the internal voltage $V_A$ be set to be higher than the standardized voltage of the external power supply voltage $V_{EXT}$ when the transistor Q1 is formed of an enhancement type MOS transistor. It should be noted that the internal voltage $V_{INT}$ is not necessary to be higher than the external power supply voltage $V_{EXT}$ but must be higher than the standardized voltage thereof. The source voltage of the transistor Q1 is slightly lower than the potential $V_{G1}$ of the node voltage N1. That is, $$V_{INT} = V_{G1} - V_{GS}$$

where $V_{GS}$ is a gate-source bias voltage of the regulator transistor Q1 which corresponds to a current consumed in a load L in the standby mode, and is approximately equal to the threshold voltage Vth of the regulator transistor Q1.

Figure 1A:
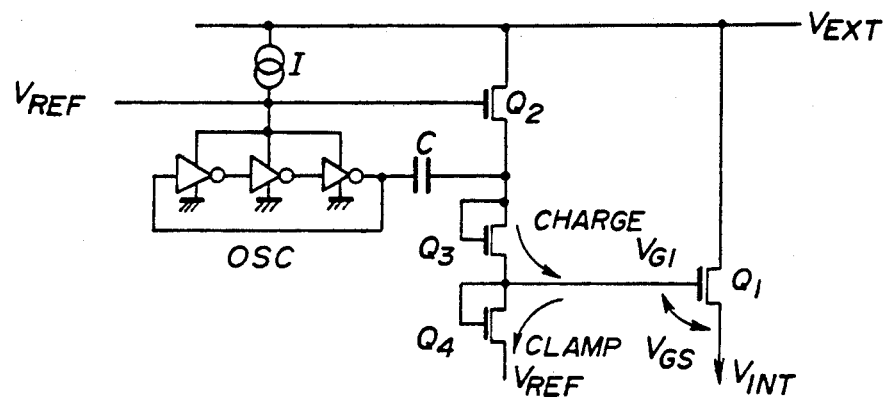
FIG. 1A is a circuit diagram of a conventional internal voltage regulator.
Figure 1B:
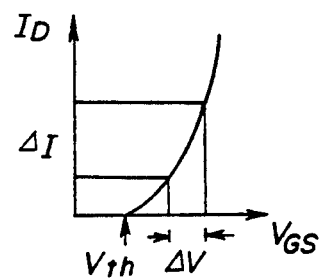
FIG. 1B is a graph illustrating a drain current vs. gate-source voltage characteristic of a regulator transistor shown in FIG. 1A.
Figure 1C:
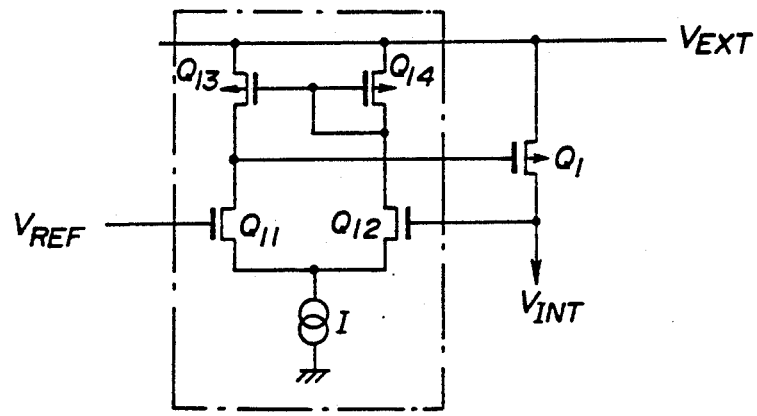
FIG. 1C is a circuit diagram of another conventional internal voltage regulator.
Figure 3:
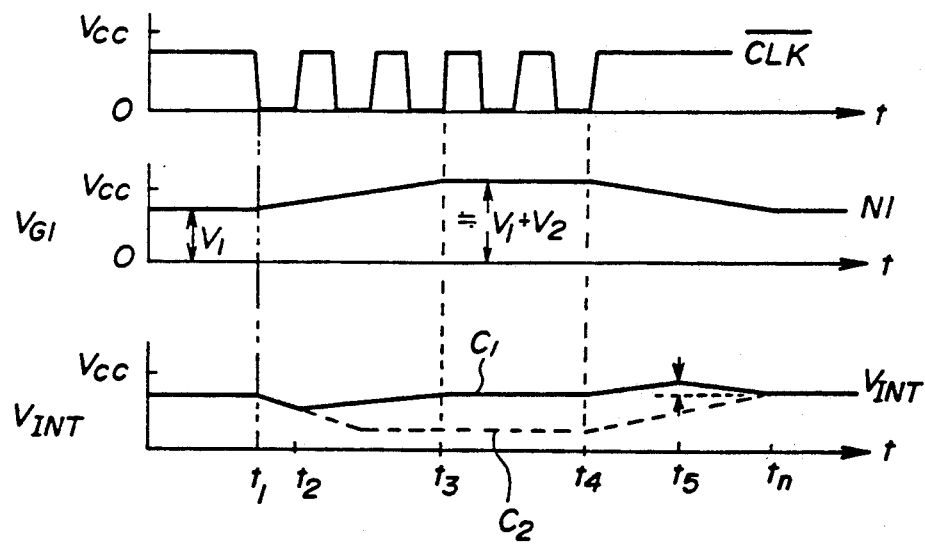
FIG. 3 is a waveform diagram illustrating the operation of the voltage regulator shown in FIG. 2.

As shown in FIG. 3, the clock signal $\overline{CLK}$ falls, so that the chip is activated and an internal circuit formed therein starts to operate. Thus, the amount of power consumed in the internal circuit starts to increase. When the clock signal $\overline{CLK}$ changes to the low level, the transistor Q30 is turned OFF. Thus, the gate voltage $V_{G1}$ of the regulator transistor Q1 increases by the voltage V2 equal to the threshold voltage Vth of the transistor Q29. An increase in the gate voltage $V_{G1}$ cooperates with a charging operation in which the current generated from the constant-current source I charges a large capacitor including the capacitor C1 and a gate capacitor of the regulator transistor Q1. As a result, the n increase in the gate voltage $V_{G1}$ does not occur rapidly. When the clock signal $\overline{CLK}$ repeatedly becomes ON and OFF some times, as shown in FIG. 3, the gate voltage $V_{G1}$ of the regulator transistor Q1 becomes equal to (V1+V2) at time $T_3$. During the period between time $t_1$ and time $t_2$, the internal voltage $V_{INT}$ is slightly decreasing. However, according to the conventional voltage regulator shown in FIG. 1A or FIG. 1C, the internal voltage $V_{INT}$ is continuously decreasing even after time $t_2$, as depicted by a broken line C2 in FIG. 3. This means that a large variation in the internal voltage $V_{INT}$ occurs. If the transistor Q30 is omitted, the internal voltage $V_{INT}$ will be decreasing continuously after time $t_2$. According to the embodiment of the present invention, each time the transistor Q30 is turned OFF, the voltage V2 equal to the threshold voltage Vth of the transistor Q29 is added to the voltage V1, so that the gate voltage $V_{G1}$ of the regulator transistor Q1 is increased.

During the time when the clock signal $\overline{CLK}$ is repeatedly turned ON and OFF, the potential of the node N1, that is, the gate voltage $V_{G1}$ is close to (V1 and V2). If the clock signal $\overline{CLK}$
is maintained at the low level for a long time, the potential of the node N1 becomes equal to (V1+V2). In other words, the regulator transistor Q1 is controlled so that the internal resistance thereof decreases. The gate voltage $V_{G1}$ of the regulator transistor Q1 is regulated in the above-mentioned way, so that a decrease in the internal voltage $V_{INT}$ is compensated for.

When the clock signal $\overline{CLK}$ returns to the standby mode, the internal circuit stop operating. Immediately after the clock signal is maintained at the high level, the potential of the node N1 is an excessively large value (over shoot). Thus, the internal voltage $V_{INT}$ is transiently increasing between time $t_4$ and time $t_5$. However, at time $t_6$, the internal voltage $V_{INT}$ returns to the original value (=V2).

As has been described above, the internal resistance of the regulator transistor Q1 is controlled on the basis of the ON/OFF frequency (or the activated period) of the clock signal $\overline{CLK}$. With this arrangement, it becomes possible to suppress variations in the internal voltage $V_{INT}$. It should be noted that the configuration shown in FIG. 2 does not use any differential amplifier circuit. Thus, there is no power consumed in such a differential amplifier circuit. In addition, there is no feedback loop and thus there is no possibility of oscillating.

As has been described above, the internal resistance of the regulator transistor Q1 is changed so that the voltage drop obtained when a small amount of current passes through the internal circuit is substantially equal to the voltage drop obtained when a large amount of current passes through the internal circuit. Generally, the load L includes a capacitor of a circuit element and/or a parasitic capacitor. The internal voltage $V_{INT}$ is associated with the charging and discharging of such a capacitor. Thus, a variation takes place slowly. When the clock signal $\overline{CLK}$ is frequently switched between the standby mode and the activate mode, the capacitance of the capacitor C and/or a change in the internal resistance of the regulator transistor Q1 are adjusted so that the internal voltage $V_{INT}$ is always substantially fixed.

A description will now be given of a second preferred embodiment of the present invention with reference to FIGS. 4A and 4B, in which those parts which are the same as those shown in FIG. 3 are given the same reference numerals. An on-chip voltage regulator 100A according to the second preferred embodiment includes the constant-current source I which is formed of a depletion type n-channel MOS transistor in which its gate and source are short-circuited. The regulator transistor Q1 is also formed of a depletion type n-channel MOS transistor in which its gate and source are short-circuited. The circuit is designed to pass a large amount of current through the regulator transistor Q1 in a five-tube characteristic region. Such an operation results in a substrate current.

Figure 4A:
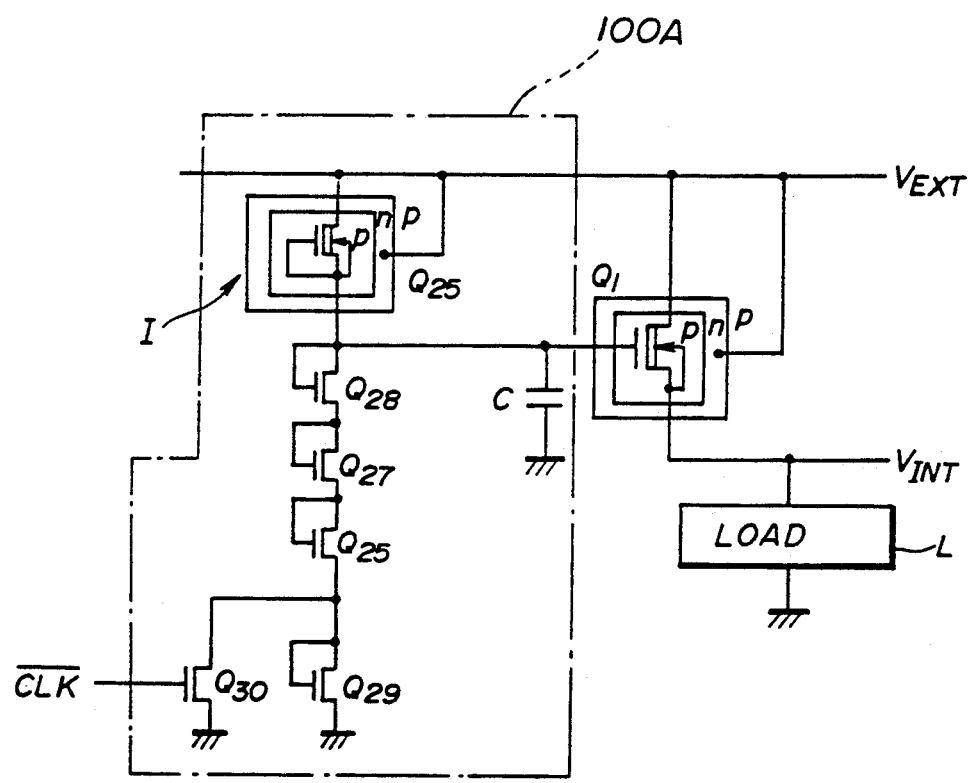
FIG. 4A is a circuit diagram of an on-chip voltage regulator according to a second preferred embodiment of the present invention.
Figure 4B:
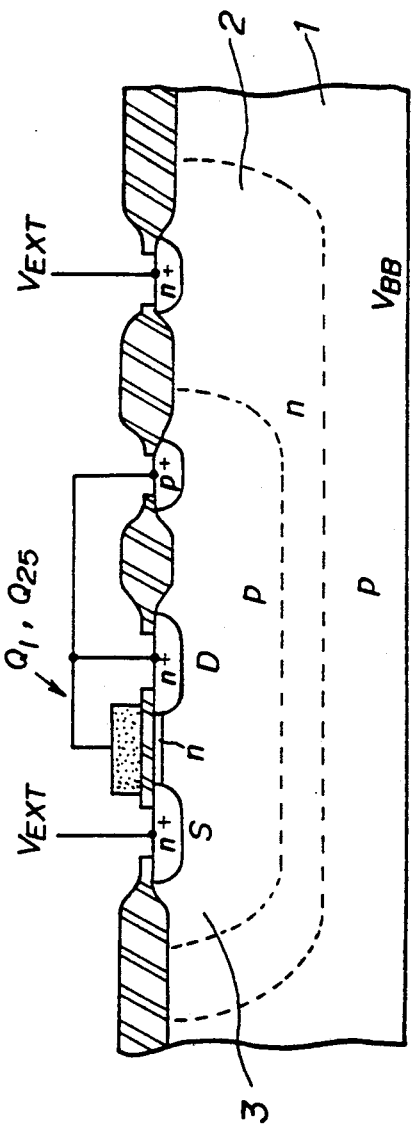
FIG. 4B is a cross-sectional view of a semiconductor layer structure which realizes some transistors shown in FIG. 4A.

FIG. 4B shows the cross section of a semiconductor chip which realizes the transistor Q1 or Q25 shown in FIG. 4A. As shown, the transistor is formed in a p-type silicon substrate 1, which is biased by a substrate bias voltage $V_{BB}$ (or $V_{SS}$) which is generated in the chip. The substrate current flows into a $V_{BB}$ generation circuit (which corresponds to a substrate bias generator, as will be described later), and causes the $V_{BB}$ generation circuit to operate unstably. In order to overcome this problem, an n-type well 2 is formed in the p-type substrate 1, and a p-type well 3 is formed in the n-type well 2. The p-type well 3 is electrically connected to a source region S. With this arrangement, the substrate current generated by the regulator transistor Q1 overlaps with the output current of the regulator transistor Q1, and thus the problem arising from the substrate current is eliminated.

The transistor Q25 can be fabricated in the same way as the regulator transistor Q25. However, the reason why the transistor Q25 is formed in the p-type well in the n-type well is different from the above-mentioned reason regarding the regulator transistor Q1. The transistor Q25 functions as a constant-current source by connecting the gate to the source. Since the constant-current output of the transistor Q25 is output from the source thereof, a change in the source voltage causes a change in a backgate voltage (which corresponds to the potential difference between the source of the transistor Q25 and the potential of the p-type substrate 1 which is the back gate), if the transistor Q25 is directly formed in the p-type substrate 1. Thus, a so-called substrate bias effect appears and deteriorates the constant-current characteristic of the transistor Q25. The substrate bias effect is such that as the back gate bias increases, the threshold voltage Vth of the transistor Q25 increases and thus the drain current decreases.

On the other hand, the layer structure shown in FIG. 4B is formed so that the back gate is the p-type well 3 in the n-type well 2, and the p-type well 3 is connected to the source 5. Thereby, when the source voltage changes, the back gate voltage also changes, so that the occurrence of a change in the drain current arising from the substrate bias effect can be suppressed. As a result, a good constant-current characteristic can be obtained.

The transistor Q25 is formed of a depletion type MOS transistor, and thus it is not necessary to provided the aforementioned voltage $V_A$ higher than the standard external power supply voltage $V_{EXT}$, as shown in FIG. 2. It is necessary to generate the voltage $V_A$ higher than the power supply voltage $V_{EXT}$ inside of the chip. Such a $V_A$ generation circuit consumes some power. Thus, it is preferable to use the configuration shown in FIG. 4A is most cases.

Figure 4C:
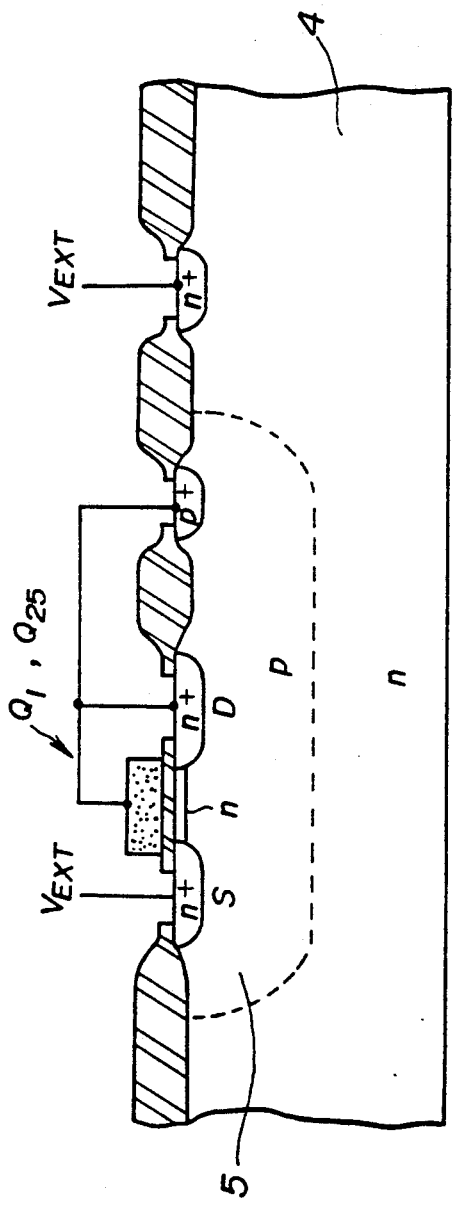
FIG. 4C is a cross-sectional view of a variation of the layer structure shown in FIG. 4B.

FIG. 4C shows the cross section of an alternative layer structure designed to preventing the occurrence of the aforementioned substrate bias effect. In order to make the back gate voltage set equal to the source voltage, a transistor is formed in a p-type well 5 formed in an n-type silicon substrate 4, and the p-type well 5 is electrically connected to the source S.

Figure 5:
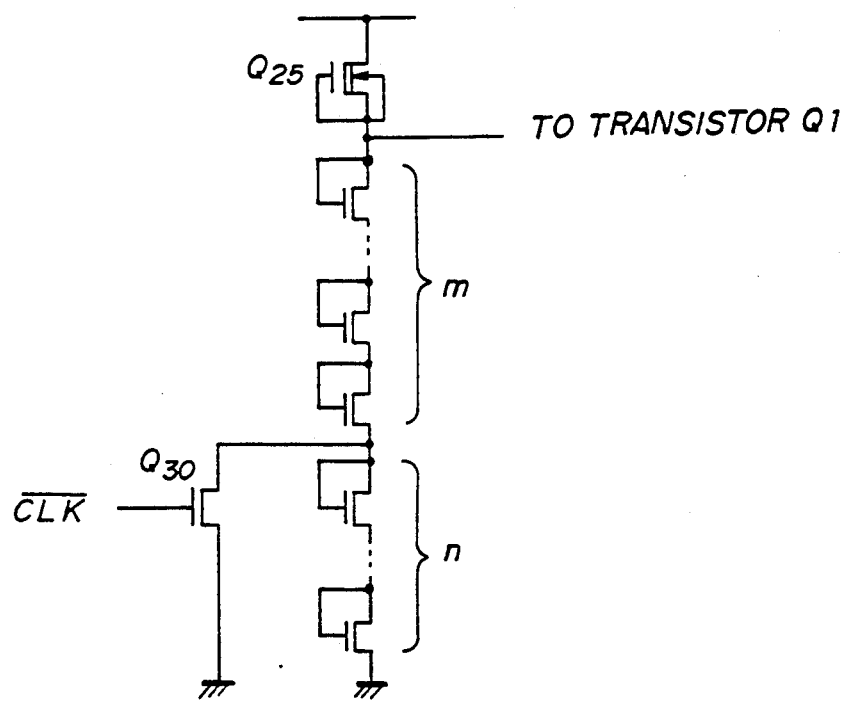
FIG. 5 is a circuit diagram of a variation of the on-chip voltage regulator shown in FIG. 2.

The circuit structure for generating and oscillating the gate voltage $V_{G1}$ of the regulator transistor Q1 is not limited to the aforementioned circuit structure. As shown in FIG. 5, m transistors (m is an integer equal to or larger than 1) and n transistors (n is an integer equal to or larger than 1) are connected in series. When the clock signal $\overline{CLK}$ is at the low level, a voltage equal to n x Vth is added to a voltage equal to m x Vth. The m transistors and n transistors can be replaced by alternative resistance elements, such as diodes.

Figure 6:
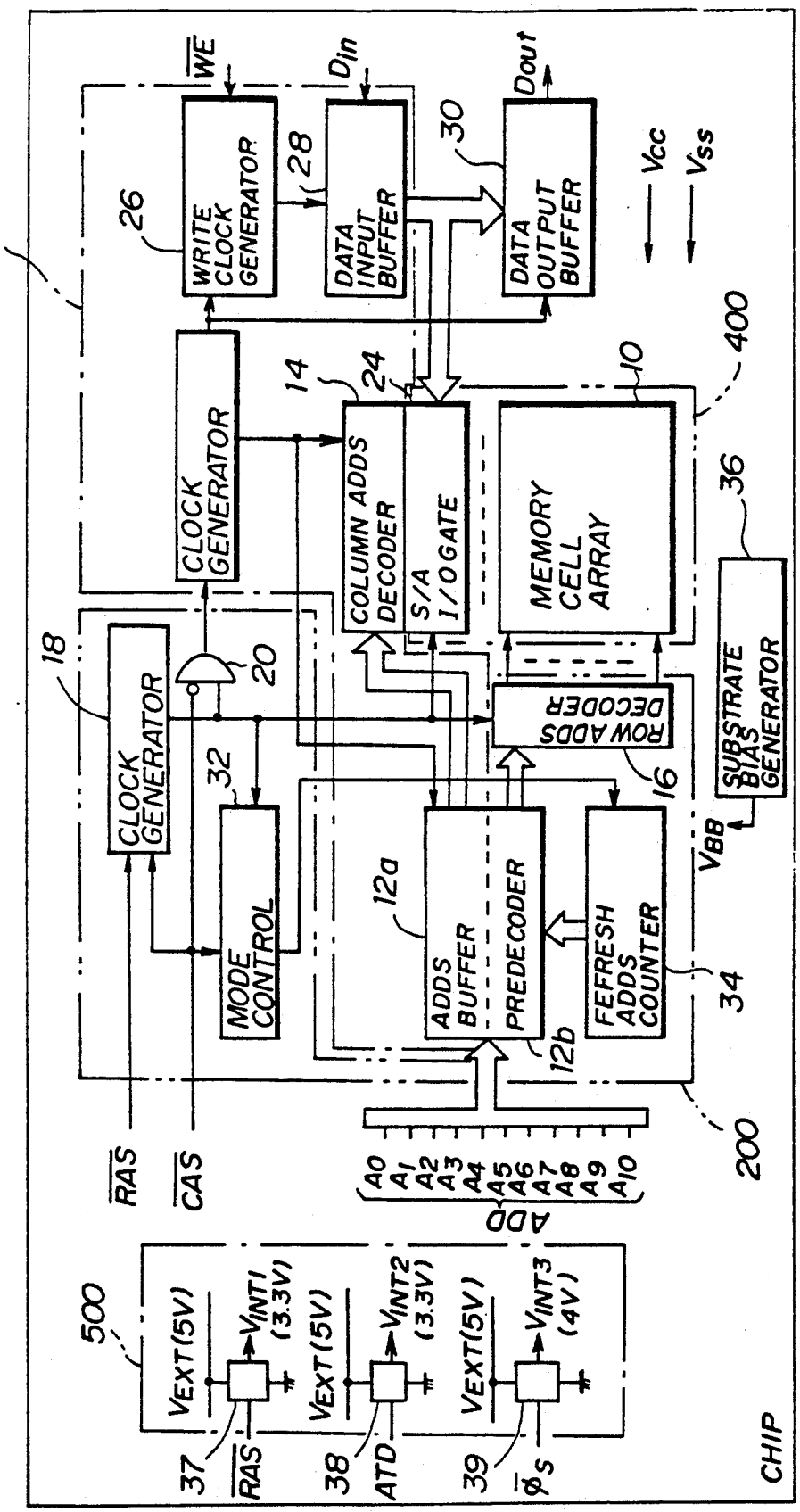
FIG. 6 is DRAM device having the on-chip voltage regulator according the present invention.

A description will now be given of a semiconductor memory device which uses the above-mentioned on-chip voltage regulator. FIG. 6 shows a DRAM device, which includes a $\overline{RAS}$ (Row Address Strobe) system 200, a $\overline{CAS}$ system (Column Address Strobe) system 300, a sense system 400 and an internal voltage generation circuit 500. The $\overline{RAS}$ system 200 operates in accordance with a row address strobe signal $\overline{RAS}$ or a clock synchronized with the $\overline{RAS}$ signal. The $\overline{CAS}$ system 300 operates in accordance with a column address strobe signal $\overline{CAS}$ or a clock synchronized with the $\overline{CAS}$ signal. The sense system 300 operates in accordance with a pair of sense amplifier driving clocks $\phi_s$ and $\phi_2$. The internal voltage generation circuit 500 includes three internal voltage generator 37, 38 and 39.

The $\overline{RAS}$ system 200 includes a predecoder 12a, a predecoder 12b, a row address decoder 16, a clock generator 18, a mode controller 32 and a refresh address counter 34. The $\overline{CAS}$ system 300 includes the address buffer 12a, the predecoder 12b, a column address decoder 14, a clock generator 22, a write clock generator 26 and a data input buffer 28. The sense system 300 includes a memory cell array 10, and a sense amplifier-/input output gate 24.

The memory cell array 10 has a plurality of memory cells arranged into rows and columns and coupled to word lines and bit lines.

A multiplexed address signal ADD consisting of address bits $A_0$ to $A_{10}$ is input to the address buffer 12a, which outputs a column address signal to the column address decoder 14. The address signal ADD is also supplied to the predecoder 12b, which outputs a row address signal to the row address decoder 16. The row address strobe signal $\overline{RAS}$ from an external device (not shown), such as a central processing unit (CPU), is input to the clock generator 18, which generates a clock signal supplied to the row address decoder 16. The row address strobe signal $\overline{RAS}$ is a low-active signal and defines a timing at which at least one of the word lines is selected by the row address decoder 16, and a timing at which at least selected one of the word lines is released from the selected state. The sense amplifier and input/output gate 24 is connected to the column address decoder 14 and the memory cell array 10.

The column address strobe signal $\overline{CAS}$ from the external device is input to an AND gate 20 through an inverter. The clock signal output by the clock generator 18 is applied to the AND gate 20, an output signal of which is input to the clock generator 22. In response to the column address strobe signal $\overline{CAS}$, the clock generator 22 generates a clock signal supplied to the column address decoder 14 as well as the address buffer 12a. When receiving the clock signal from the clock generator 22, the column address decoder 14 selects a corresponding one of pairs of bit lines or more. The sense amplifier and input/output gate 24 is coupled to the bit lines running in the memory cell array 10. When writing data Din into the memory cell array 10 or reading out data Dout therefrom, the data is amplified by a sense amplifier provided in the sense amplifier and input/output gate 24.

The write clock generator 26 receives the clock signal from the clock generator 22 and a write enable signal $\overline{WE}$ supplied from the external device, and generates a write clock. The data input buffer 28 inputs data Din at a timing defined by the write clock supplied from the write clock generator 26. Data output from the data input buffer 28 is input to the sense amplifier and input-/output gate 24 and is written into the memory cell array 10. Data output from the sense amplifier and input/output gate 24 is input to a data output buffer 30, which outputs the input data in synchronism with the clock signal from the clock generator 22. The mode controller 32 receives the column address strobe signal $\overline{CAS}$ and the clock signal from the clock generator 18, and generates a mode signal corresponding to predetermined conventional operation modes, such as a read/-write mode, a read modified write mode and a $\overline{CAS}$ before $\overline{RAS}$ refresh mode. The mode signal from the mode controller 32 is input to the refresh address counter 34, which generates an address signal showing a memory cell to be refreshed. A substrate bias generator 36 generates a substrate bias voltage, such as the aforementioned voltage $V_{BB}$.

The internal voltage generator 37 of the internal voltage generation circuit 500 is configured according to the present invention. For example, the internal voltage generator 37 has the structure shown in FIG. 4A. The internal voltage generator 37 generates an internal voltage $V_{INT1}$, which is regulated by the $\overline{RAS}$ signal, which is input, as the clock signal $\overline{CLK}$, to the gate of the transistor Q30. As will be described later with reference to FIGS. 8 and 9, it is possible to generate one-shot pulses from the fall of the $\overline{RAS}$ signal and output the one-shot pulse to the gate of the transistor Q30 as the clock signal $\overline{CLK}$. It is also possible to generate a plurality of consecutive pulses from the fall of the $\overline{RAS}$ signal and output the pulses to the gate of the transistor Q30. The internal voltage $V_{INT1}$ is supplied to the $\overline{RAS}$ system 200. The external power supply voltage $V_{EXT}$ is equal to 5 volts (Vcc), and the internal voltage $V_{INT1}$ is equal to, for example, 3.3 volts.

The internal voltage generator 38 is also configured in the same way as the circuit shown in FIG. 4A. The internal voltage generator 38 generates an internal voltage $V_{INT2}$, which is regulated by an address transition detection signal ATD, which is input, as the clock signal $\overline{CLK}$, to the gate of the transistor Q30. The internal voltage $V_{INT2}$ is supplied to the $\overline{CAS}$ system 300. The internal voltage $V_{INT2}$ is equal to, for example, 3.3 volts.

The address transition signal ATD is generated when a change in the address signal ADD is detected. An address transition detector is provided in, for example, the block of the address buffer 12a.

Figure 7:
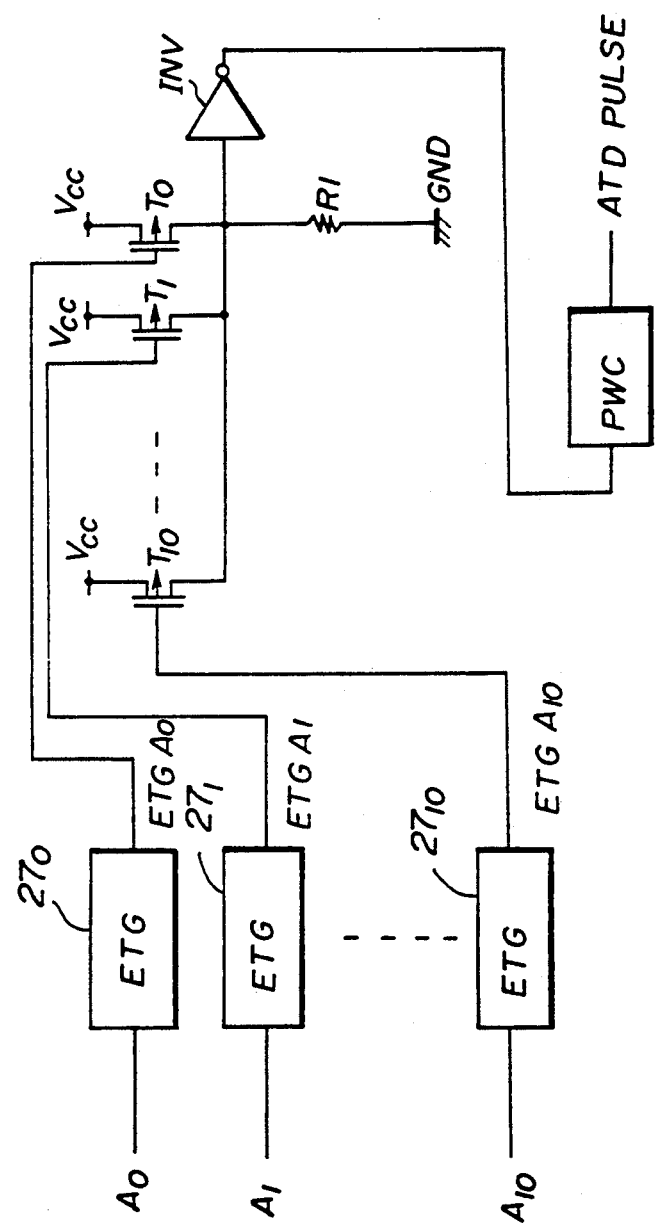
FIG. 7 is a circuit diagram of an address transition detector provided in the DRAM shown in FIG. 6.

FIG. 7 is a block diagram of the address transition detector. As shown, the address transition detector is made up of conventional edge trigger circuits $27_0$-$27_{10}$ provided for the respective address bits $A_0$-$A_{10}$, p-channel MOS transistors $T_0$-$T_{10}$, an inverter INV, a resistor R1 and a pulse width controller PWC. The edge trigger circuits $20_0$-$27_{10}$ detect the edges of the corresponding address bits and generates edge trigger signals $ETGA_0$-$ETGA_{10}$, which are respectively applied to the gates of the transistors $T_0$-$T_{10}$. When one of the edge trigger signals $ETGA_0$-$ETGA_{10}$ becomes active (low level), the corresponding transistor is turned ON, so that a high level is applied to the inverter INV. The inverter INV outputs a low level to the pulse width controller PWC, which generates the ATD pulse having a predetermined pulse duration.

Turning now to FIG. 6, the internal voltage generator 39 is also configured in the same way as the circuit shown in FIG. 4A. The internal voltage generator 39 generates an internal voltage $V_{INT3}$, which is regulated by the aforementioned sense amplifier driving clock $\phi_s$ generated by the clock generator 18. The internal voltage $V_{INT3}$ is supplied to the sense system 400. The internal voltage $V_{INT3}$ is equal to, for example, 4.0 volts.

Figure 8:
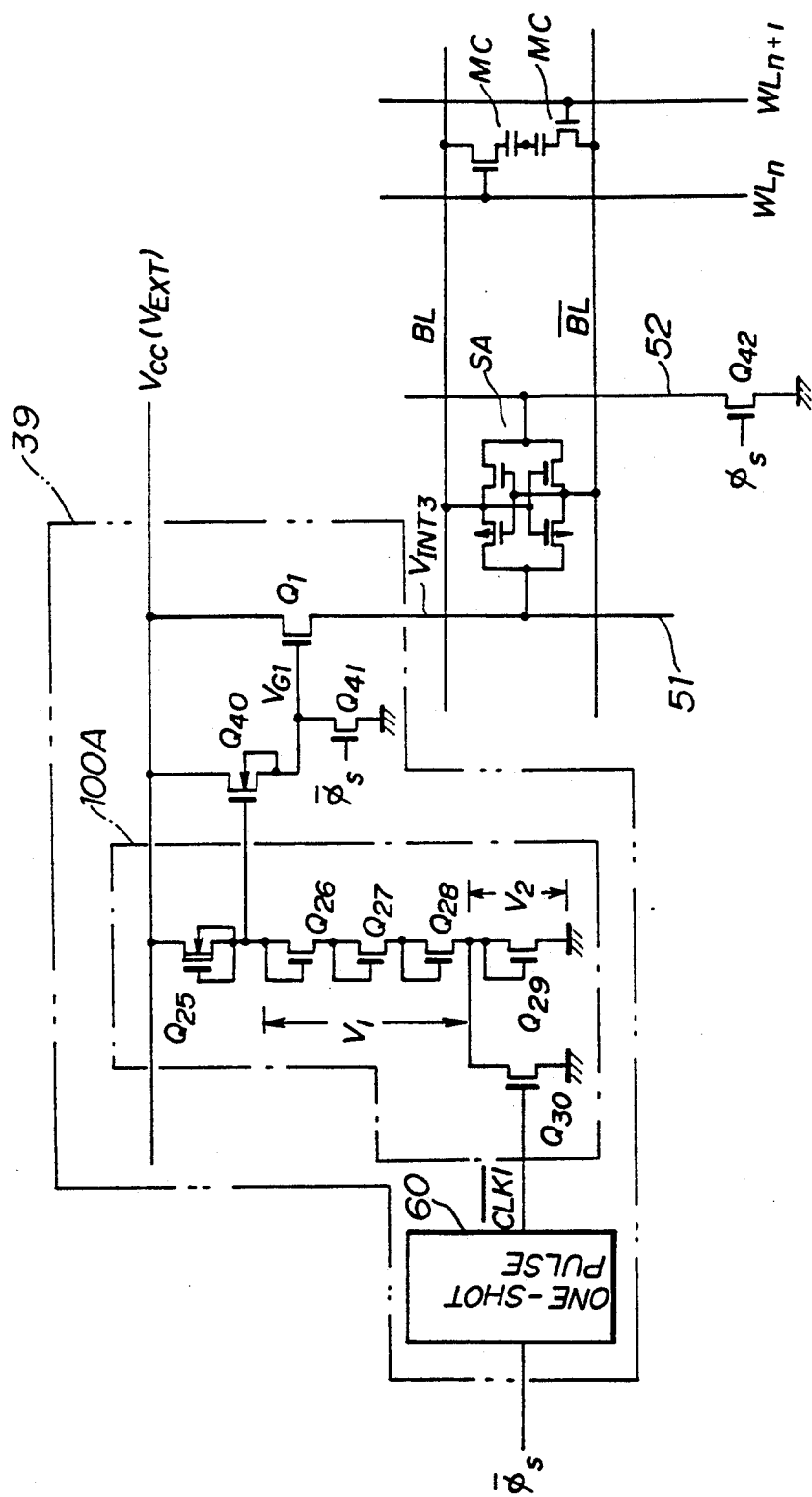
FIG. 8 is a circuit diagram of an internal voltage generator shown in FIG. 6.

FIG. 8 is a circuit diagram of the internal voltage generator 39 and a part of the sense amplifier and I/O gate 24. The internal voltage generator 39 is made up of the aforementioned voltage regulator 100A, a one-shot pulse generator 60, the regulator transistor Q1, two n-channel MOS transistors Q40 and Q41. The gate of the regulator transistor Q1 is controlled by the voltage regulator 100A via the transistor Q40. The drain of the transistor Q41 is connected to the gate of the regulator transistor Q1, and the source of the transistor Q41 is grounded. The source of the regulator transistor Q1 is connected to a high-potential line 51. A sense amplifier SA is connected to a pair of bit lines BL and $\overline{BL}$, to which memory cells MC are connected, as shown in FIG. 8. The memory cells MC shown in FIG. 8 are respectively connected to word lines $WL_n$ and $WL_{n+1}$. The one-shot pulse generator 60 generates a one-shot pulse CLK1 is synchronism with the same amplifier driving signal $\phi_s$. More specifically, the one-shot pulse CLK1 changes to the low level in synchronism with the fall of the sense amplifier driving signal $\phi_s$.

The sense amplifier SA is also connected to the high-potential voltage line 51 and a low-potential voltage line 52. An n-channel MOS transistor Q42 is provided in the low-potential voltage line 52. During the time when the same amplifier SA is maintained in the inactive state, the sense amplifier driving signals $\phi_s$ and $\overline{\phi_s}$ are maintained at the low and high levels, respectively. Thus, the transistor Q40 and Q41 are turned OFF and ON, respectively, so that the sense amplifier SA is substantially disconnected from the voltage lines 51 and 52. On the other hand, when the sense amplifier SA is made active, the clock signals $\phi_s$ and $\overline{\phi_s}$ are reversed, so that the sense amplifier SA starts to operate.

Figure 9:
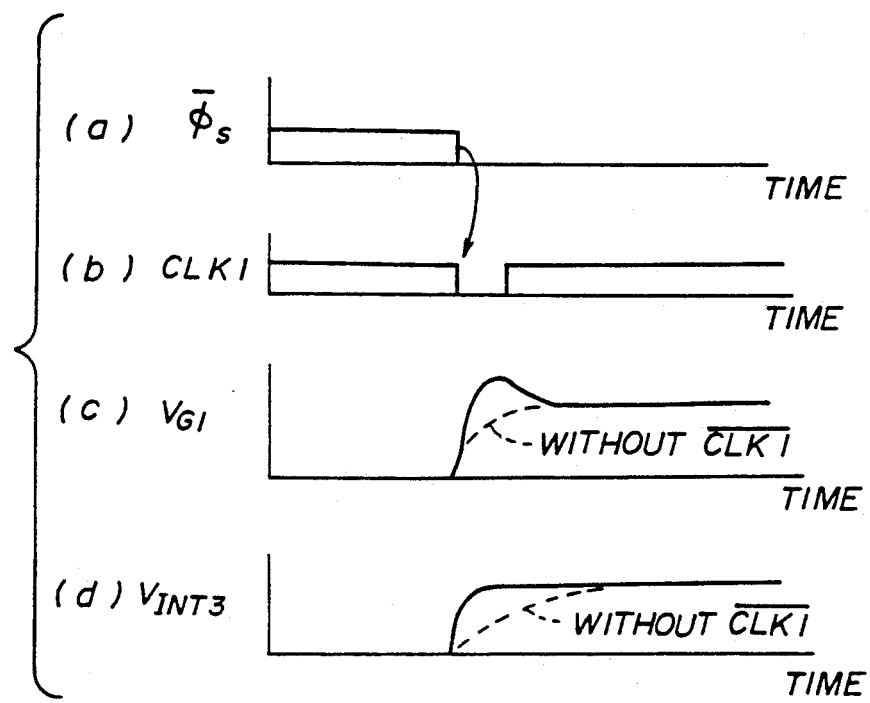
FIG. 9 is a waveform diagram illustrating the operation of the circuit shown in FIG. 8.

At this time, as shown in FIG. 9-(a), the sense amplifier driving signal $\phi_s$ changes from the high level to the low level, and as shown in FIG. 9-(b), the one-shot pulse CLK1 falls. Thus, the transistor Q30 is turned OFF, so that the gate voltage $V_{G1}$ increases rapidly, as shown in FIG. 9-(c). This rise of the gate voltage $V_{G1}$ is slightly over-shooting. If the one-shot pulse CLK1 is not provided, the gate voltage $V_{G1}$ will increase gradually from the ground potential, as illustrated by the broken line in FIG. 9(c). As shown in FIG. 9-(d), the internal voltage $V_{INT3}$ increases rapidly in response to the rapid increase in the gate voltage $V_{G1}$. On the other hand, the internal voltage $V_{INT3}$ will increases gradually if the one-shot pulse CLK1 is not provided.

In can been from the above description, that the state where the sense amplifier SA starts to operate is detected from the sense amplifier driving signal $\phi_s$, and the gate voltage $V_{G1}$ of the regulator transistor Q1 is increased when the above state is detected. It is possible to generate a plurality of pulses like the clock signal CLK from the sense amplifier driving clock $\phi_s$ and output these pulses to the gate of the transistor Q30.

As has been described above, during the time when the $\overline{RAS}$ signal or an equivalent internal timing clock generated in the chip is maintained in the low level (activate state), the transistor Q30 is continuously or intermittently turned OFF, so that the gate voltage $V_{G1}$ of the regulator transistor Q1 is increased. With this arrangement, it is possible to compensate for a decrease in the internal voltage $V_{INT1}$ after the $\overline{RAS}$ system 200 starts to operate. On the other hand, the $\overline{RAS}$ signal is maintained in the high level (inactive state), the $\overline{RAS}$ system 200 consumes a small amount of power, so that the transistor Q29 is short-circuited by the transistor Q30. The $\overline{CAS}$ system 300 and the sense system 400 are also controlled in the same way as the $\overline{RAS}$ system 200.

Figure 10:
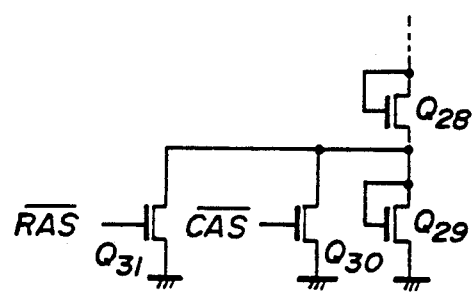
FIG. 10 is a circuit diagram of a variation of the internal voltage generator shown in FIG. 6.

In the structure shown in FIG. 6, the internal voltage $V_{INT1}$ supplied to the $\overline{RAS}$ system 200 is controlled separately from the internal voltage $V_{INT2}$ supplied to the $\overline{CAS}$ system 300. Alternatively, as shown in FIG. 10, it is possible to regulate the internal voltages $V_{INT1}$ and $V_{INT2}$ on the basis of a composite logic of the $\overline{RAS}$ signal and the $\overline{CAS}$ signal or the equivalent internal timing clocks generated in the chips. As shown in FIG. 10, an n-channel MOS transistor Q31 is connected in parallel to the transistor Q30. The $\overline{RAS}$ signal is applied to the gate of the transistor Q31, and the $\overline{CAS}$ signal is applied to the gate of the transistor Q30. When both the $\overline{RAS}$ and $\overline{CAS}$ signals are maintained at the low level, the gate voltage $V_{G1}$ of the regulator transistor Q1 is increased. In a normal $\overline{CAS}$-before-$\overline{RAS}$ refresh mode, the refresh operation starts when the $\overline{CAS}$ signal changes to the low level before the $\overline{RAS}$ signal changes to the low level. If the internal voltage compensation operation starts when the $\overline{CAS}$ signal becomes the low level, the internal voltage will be compensated for excessively because the $\overline{CAS}$ system 300 does not operate in the $\overline{CAS}$-before-$\overline{RAS}$ mode. In the configuration shown in FIG. 10, when both the $\overline{CAS}$ and $\overline{RAS}$ signals are maintained in the low level, the compensation operation starts.

The on-chip voltage regulator according to the present invention can be applied to not only DRAMs but also SRAMs. In the SRAMs, a chip enable signal $\overline{CE}$ and an output enable signal $\overline{OE}$ are used as the clock signal $\overline{CLK}$. Further, the present invention is suitable for logic LSIs.

The present invention is not limited to the specifically disclosed embodiments, and variations and modifications may be made without departing from the scope of the present invention.

What is claimed is:

1. An on-chip voltage regulator for controlling a gate of a regulator transistor having a first terminal connectable to receive an external power supply voltage and a second terminal connectable to an internal circuit formed on a chip on which said on-chip voltage regulator is formed, said on-chip voltage regulator comprising:

clock receiving means for receiving a predetermined clock signal related to an operation of said internal circuit; and regulator means, coupled to said clock receiving means and said regulator transistor, for generating a gate voltage output to the gate of said regulator transistor on the basis of a state of said predetermined clock signal so that said regulator transistor can generate a substantially fixed internal voltage from said external power supply voltage irrespective of whether or not said internal circuit is operating.

2. An on-chip voltage regulator as claimed in claim 1, wherein said regulator means comprises means for outputting a first gate voltage supplied to the gate of said regulator transistor when said predetermined clock signal is maintained at a first state and for generating a second gate voltage supplied to the gate of said regulator transistor when said predetermined clock signal is maintained at a second state.

3. An on-chip voltage regulator as claimed in claim 1, wherein said voltage regulator comprises means for increasing said gate voltage output to the gate of said regulator transistor when said predetermined clock signal changes from a first state indicating that said internal circuit is maintained in a standby mode to a second state indicating said internal circuit is operating.

4. An on-chip voltage regulator as claimed in claim 1, wherein said on-chip voltage regulator further comprises pulse generating means for generating said predetermined clock signal from a state indicating signal indicating whether or not said internal circuit is operating.

5. An on-chip voltage regulator as claimed in claim 4, wherein said pulse generating means generates a one-shot pulse when said state indicating signal indicates that said internal circuit starts to operate.

6. An on-chip voltage regulator as claimed in claim 1, wherein said on-chip voltage regulator comprises pulse generating means for receiving a plurality of state indicating signals which indicate whether or not respective corresponding parts of said internal circuit are operating and for generating said predetermined clock signal from said plurality of state indicating signals.

7. An on-chip voltage regulator as claimed in claim 1, wherein said regulator means comprises:

a constant-current source connectable to receive a first predetermined power supply voltage;

first voltage generating means, connected to said constant-current source in series and connected to the gate of said regulator transistor, for generating a first voltage from a constant current generated by said constant-current source;

second voltage generating means, connected to said first voltage generating means in series and connectable to receive a second predetermined power supply voltage lower than said first predetermined voltage, for generating a second voltage from said constant current supplied from said constant-current source through said first voltage generating means; and control means, coupled to said second voltage generating means, for selectively short-circuiting said second voltage generating means on the basis of the state of said predetermined clock signal so that either a voltage equal to the sum of said first voltage and second voltage or said first voltage is selectively output, as said gate voltage, to the gate of said regulator transistor.

8. An on-chip voltage regulator as claimed in claim 7, wherein:

said first voltage generating means comprises m field effect transistors where m is an integer equal to or larger than 1;

said m field effect transistors are diode-connected and connected in series; and said first voltage substantially corresponds to the sum of threshold voltages of said m field effect transistors.

9. An on-chip voltage regulator as claimed in claim 7, wherein:

said second voltage generating means comprises n field effect transistors where n is an integer equal to or larger than 1;

said n field effect transistors are diode-connected and connected in series; and said second voltage substantially corresponds to the sum of threshold voltages of said n field effect transistors.

10. An on-chip voltage regulator as claimed in claim 7, wherein said control means comprises a transistor having a control terminal connectable to receive said predetermined clock signal, a first terminal connected to a node where said first voltage generating means and said second voltage generating means are connected in series, and a second terminal connectable to receive said second predetermined power supply voltage.

11. An on-chip voltage regulator as claimed in claim 7, wherein:

said constant-current source comprises a field effect transistor of a depletion type; and said field effect transistor of said constant-current source comprises a gate terminal, a first terminal connectable to receive said first predetermined power supply voltage, and a second terminal connected to said gate terminal and the gate of said regulator transistor.

12. An on-chip voltage regulator as claimed in claim 11, wherein said field effect transistor comprises:
a substrate having a first conductivity type;
a first well formed in said substrate and having a second conductivity type opposite to said first conductivity type;
a second well formed in said first well and having the first conductivity type;
a first diffusion region formed in said second well and having the second conductivity type, said first diffusion region corresponding to said first terminal;
a second diffusion region formed in said second wall and having the second conductivity type, said second diffusion region corresponding to said second terminal; and
a gate positioned between said first and second diffusion regions, said gate corresponding to said gate terminal.

13. An on-chip voltage regulator as claimed in claim 12, wherein said first well is connectable to receive said external power supply voltage.

14. An on-chip voltage regulator as claimed in claim 11, wherein said first predetermined power supply voltage is equal to said external power supply voltage.

15. An on-chip voltage regulator as claimed in claim 11, wherein said field effect transistor comprises:
a substrate having a first conductivity type;
a well formed in said substrate and having a second conductivity type opposite to said first conductivity type;
a first diffusion region formed in said well and having the first conductivity type, said first diffusion region corresponding to said first terminal;
a second diffusion region formed in said well and having the first conductivity type, said second diffusion region corresponding to said second terminal; and
a gate positioned between said first and second diffusion regions, said gate corresponding to said gate terminal.

16. An on-chip voltage regulator as claimed in claim 15, wherein said first wall is connectable to receive said external power supply voltage.

17. An on-chip voltage regulator as claimed in claim 7, wherein said on-chip voltage regulator comprises a capacitor having a first terminal coupled to the gate of said regulator transistor, and a second terminal connectable to receive said reference voltage.

18. An on-chip voltage regulator as claimed in claim 1, wherein said regulator means comprises means for changing an internal resistance of said regulator transistor on the basis of the state of said predetermined clock.

19. An on-chip voltage regulator as claimed in claim 1, wherein said regulator means comprises:
constant-current generation means for generating a constant current; and
variable resistance means, coupled to said constant-current generation means and said regulator transistor, for providing a variable resistance dependent on the state of said predetermined clock and for outputting a voltage obtained by passing said constant current through said variable resistance means to the gate of said regulator transistor.

20. A semiconductor memory device comprising:
a first system operating in accordance with a first clock signal and having a memory cell array and a sense amplifier coupled to said memory cell array;
a second system operating in accordance with a second clock signal and having row address means for generating a row address from an external address and for outputting said row address to said memory cell array;
a third system operating in accordance with a third clock signal and having column address means for generating a column address from said external address and for outputting said column address to said memory cell array; and
internal voltage generating means, coupled to said first, second and third systems, for generating first, second and third internal voltages from an external power supply voltage on the basis of states of said first, second and third clock signals and for outputting said first, second and third internal voltages to said first, second and third systems, respectively,
wherein said internal voltage generating means comprises:
a regulator transistor provided for each of said first, second and third systems and having a first terminal connectable to receive said external power supply voltage and a second terminal connected to a corresponding one of said first, second and third systems; and
regulator means, connected to said regulator transistor, for generating a gate voltage output to the gate of said regulator transistor on the basis of the state of at least one of said first, second and third clock signals so that a corresponding one of said first, second and third internal voltage is substantially fixed irrespective of whether or not said corresponding one of the first, second and third systems is operating.

21. A semiconductor memory device as claimed in claim 20, wherein:
said regulator means comprises means for controlling the gate voltage output to the gate of said regulator transistor provided for said first system on the basis of the state of said first clock signal; and
said first clock signal is synchronized with a sense amplifier driving signal which drives said sense amplifier.

22. A semiconductor memory device as claimed in claim 21, further comprising pulse generating means for generating a one-shot pulse from said sense amplifier driving signal, said one-shot pulse corresponding to said first clock signal.

23. A semiconductor memory device as claimed in claim 20, wherein:
said regulator means comprises means for generating the gate voltage output to the gate of said regulator transistor provided for said second system on the basis of the state of said second clock signal; and
said second clock signal is a row address strobe signal supplied from an external device.

24. A semiconductor memory device as claimed in claim 20, wherein:
said regulator means comprise means for generating the gate voltage output to the gate of said regulator transistor provided for said second system on the basis of the state of said second clock signal; and said semiconductor memory device comprises address transition detection means for detecting a change in said external address and for outputting a pulse signal when the change in said external address is detected, said pulse signal corresponding to said second clock signal.

25. A semiconductor memory device as claimed in claim 20, wherein said regulator means comprises means for generating the gate voltage output to the gate of said regulator transistor provided for each of said second and third systems on the basis of the states of said second and third clock signals.

26. A semiconductor integrated circuit device comprising:

a regulator transistor having a first terminal connectable to receive an external power supply voltage, a second terminal through which an internal power supply voltage lower than said external power supply voltage, and a gate; and means, coupled to the gate of said regulator transistor, for changing an internal resistance of said regulator transistor in accordance with a clock which controls active/inactive states of an internal circuit of said semiconductor integrated circuit device to thereby suppress a difference between the internal power supply voltage obtained when the internal circuit is maintained in the active state and the internal power supply voltage obtained when the internal circuit is maintained in the active state.

27. A semiconductor integrated circuit device comprising:

an on-chip voltage control circuit which drops an external power supply voltage to thereby generate an internal power supply voltage supplied to an internal circuit of said semiconductor integrated circuit device; and means, coupled to said on-chip voltage control circuit, for controlling a current supply ability of said on-chip voltage control circuit so that said current supply ability obtained when said internal circuit is maintained in an active state is greater than said current supply ability obtained when said internal circuit is maintained in an active state.

28. A semiconductor integrated circuit device comprising:

an on-chip voltage control circuit which drops an external power supply voltage to thereby generate an internal power supply voltage supplied to an internal circuit of said semiconductor integrated circuit device; and means, coupled to said on-chip voltage control circuit, for controlling a current supply ability of said on-chip voltage control circuit so that said current supply ability increases temporarily in response to a switching of a state of said internal circuit from an inactive state to an active state.

29. A semiconductor integrated circuit device comprising:

a first system operating in accordance with a sense amplifier driving signal and having a memory cell array and a sense amplifier coupled to said memory cell array;

a second system operating in accordance with a row address strobe signal and having row address means for generating a row address from an external address and for outputting said row address to said memory cell array;

a third system operating in accordance with a column address strobe signal signal and having column address means for generating a column address from said external address and for outputting said column address to said memory cell array; and an on-chip voltage control circuit which is coupled to said first, second and third systems which generates first, second and third internal power supply voltages from an external power supply voltage, said on-chip voltage control circuit comprising means for controlling a current driving ability of said on-chip voltage control circuit in accordance with at least one predetermined clock signal.

30. A semiconductor integrated circuit device as claimed in claim 29, wherein said on-chip voltage control circuit comprises:

first internal power supply voltage generating means for inputting a first predetermined clock signal which is the same as or synchronized with said sense amplifier driving signal and for generating a first internal power supply voltage to said first system;

second internal power supply voltage generating means for inputting a second predetermined clock signal which is the same as or synchronized with said row address strobe signal and for generating a second internal power supply voltage to said second system; and third internal power supply voltage generating means for inputting a third predetermined clock signal which is the same as or synchronized with said column address strobe signal and for generating a third internal power supply voltage to said third system.

* * * * *

UNITED STATES PATENT AND TRADEMARK OFFICE
CERTIFICATE OF CORRECTION

PATENT NO. : 5,097,303
DATED : March 17, 1992
INVENTOR(S) : Masao TAGUCHI

It is certified that error appears in the above-indentified patent and that said Letters Patent is hereby corrected as shown below:

In Column 15, Claim 26, Line 31, change "active" to -- inactive --.

In Column 15, Claim 27, Line 45, change "active" to -- inactive --.

Signed and Sealed this

Fourth Day of April, 1995

BRUCE LEHMAN

Attest:

Attesting Officer

Commissioner of Patents and Trademarks